(12) United States Patent
Lev et al.

(10) Patent No.: US 9,851,745 B2
(45) Date of Patent: Dec. 26, 2017

(54) LATCH FOR A COMPUTER CASE

(75) Inventors: Jeffrey A. Lev, Tomball, TX (US); Chia-Ming Tsai, Taipei (TW); Hui Leng Lim, Sugar Land, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/426,960

(22) PCT Filed: Sep. 12, 2012

(86) PCT No.: PCT/US2012/054722
§ 371 (c)(1),
(2), (4) Date: Mar. 9, 2015

(87) PCT Pub. No.: WO2014/042620
PCT Pub. Date: Mar. 20, 2014

(65) Prior Publication Data
US 2015/0220108 A1 Aug. 6, 2015

(51) Int. Cl.
*G06F 1/16* (2006.01)
*H05K 5/02* (2006.01)

(52) U.S. Cl.
CPC .............. *G06F 1/16* (2013.01); *G06F 1/1679* (2013.01); *H05K 5/0221* (2013.01); *Y10T 29/49895* (2015.01)

(58) Field of Classification Search
CPC ........ G06F 1/16; G06F 1/1679; H05K 5/0221
See application file for complete search history.

(56) References Cited

U.S. PATENT DOCUMENTS

| 6,373,692 | B1 | 4/2002 | Cheng | |
|---|---|---|---|---|
| 8,576,562 | B2 * | 11/2013 | Schwager | ............... G06F 1/162 |
| | | | | 361/679.26 |
| 8,699,223 | B2 * | 4/2014 | Yu | ......................... G06F 1/1679 |
| | | | | 292/251.5 |
| 8,699,233 | B2 * | 4/2014 | Palm et al. | .................... 361/761 |
| 2002/0085343 | A1 | 7/2002 | Wu et al. | |
| 2004/0027795 | A1 | 2/2004 | Lee et al. | |
| 2007/0206352 | A1 | 9/2007 | Lee | |
| 2010/0132419 | A1 | 6/2010 | Wen-Wei et al. | |
| 2011/0130799 | A1 * | 6/2011 | Kubat et al. | ...................... 607/5 |
| 2012/0057280 | A1 | 3/2012 | Hoshino | |

(Continued)

FOREIGN PATENT DOCUMENTS

CN  1746812  3/2006
CN  2846842  12/2006
(Continued)

OTHER PUBLICATIONS

Merriam-Webster's dictionary, May 6, 2016, [ online], Retrieved from Merriam-Webster's using Internet <URL: http://www.merriam-webster.com/dictionary/laptop>.*

(Continued)

*Primary Examiner* — Matthieu F Setliff
*Assistant Examiner* — Thomas Neubauer
(74) *Attorney, Agent, or Firm* — HP Inc Patent Department

(57) ABSTRACT

A latch is disclosed. The latch has a hook that rotates to engage with a case for a computer. The hook has one side fabricated from a ferrous material. The hook is unlatched by placing a magnet near the ferrous material thereby causing the hook to rotate and disengage with the top case.

20 Claims, 3 Drawing Sheets

(56) References Cited

U.S. PATENT DOCUMENTS

2012/0106065 A1    5/2012  Yu
2012/0206873 A1    8/2012  Schwager et al.

FOREIGN PATENT DOCUMENTS

| | | |
|---|---|---|
| CN | 201837922 | 5/2011 |
| CN | 102147844 | 8/2011 |
| JP | 2011033122 | 2/2011 |
| KR | 20070106248 | 11/2007 |

OTHER PUBLICATIONS

Merriam-Webster's dictionary, May 6, 2016, [online], Retrieved from Merriam-Webster's using Internet <URL: http://www.merriam-webster.com/dictionary/motherboard>.*
International Searching Authority, The International Serarch Report and the Written Opinion, dated Mar. 18, 2013, 10 Pages.
Pawashe, C. et al., Magnetic Mobile Micro-robots, (Research Paper).

* cited by examiner

LATCH FOR A COMPUTER CASE

BACKGROUND

Portable computers typically have a top and bottom case that are joined together to form an enclosure for the internal components. Users may need to open the case to add or remove components, change the battery, or to replace damaged components.

DETAILED DESCRIPTION

Figure 1A:
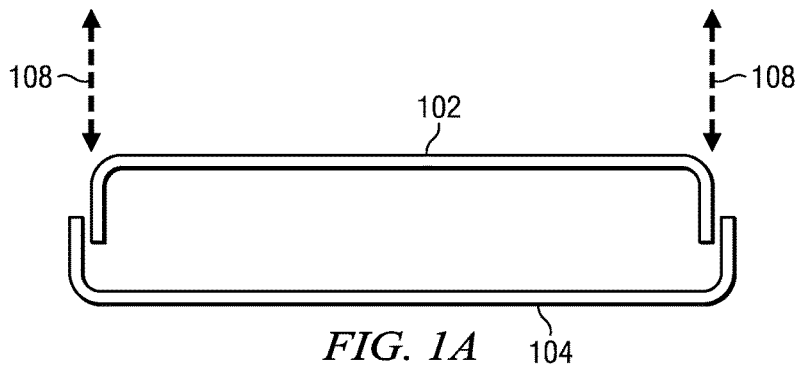
FIG. 1A is an example two part case for a computer.
Figure 1B:
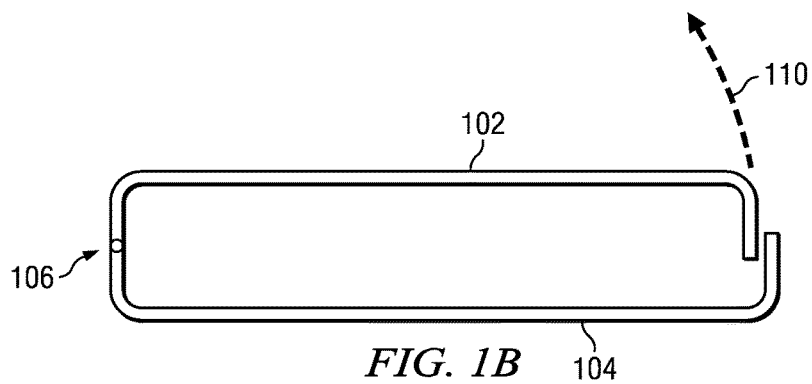
FIG. 1B is an example hinged two part case for a computer.

FIG. 1A is an example two part case for a computer, for example a notebook or portable computer. The two part case has a top case 102 and a bottom case 104 that fit or mate together in a clam shell style. The top case 102 can be installed or removed from the bottom case in a linear fashion as shown by arrows 108. FIG. 1B is another example of a two part case that is joined together with a hinge 106 along one edge. The top case 102 in FIG. 1B is opened or closed by rotating the top case 102 about hinge 106. In both FIGS. 1A and 1B the top 102 and bottom 104 cases form an enclosure that can contain internal computer components when the cases are closed or mated together. The internal computer components can comprise a motherboard, memory, hard disk drives, DVD drives, I/O cards and the like.

Figure 2A:
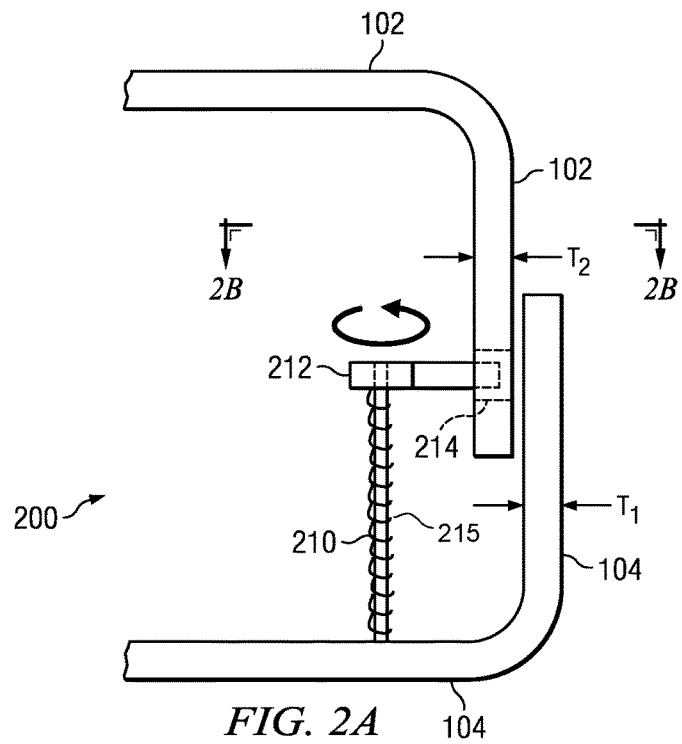
FIG. 2A is a side view of an example latch 200.
Figure 2B:
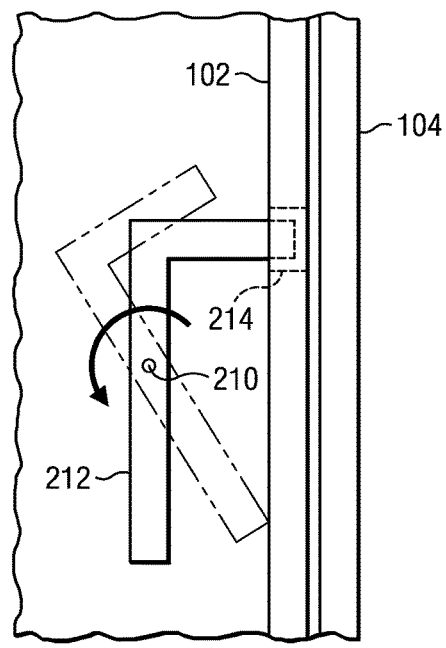
FIG. 2B is a top sectional view of the example latch as seen from AA in FIG. 2A

Once in the mated position, the top case 102 and the bottom case 104 may be held together by tabs, or a hinge, and one or more latches. FIG. 2A is a side view of an example latch 200. Latch 200 comprises a shaft 210 and a hook 212. The shaft may be mounted to the inside surface of the bottom case 102. Hook 212 is mounted on shaft 210 and can rotate about the shaft 210 from a first or "open" position to a second or "latched" position. Hook 212 is shown in the "latched" position in FIG. 2A. FIG. 2B is a top sectional view of latch as seen from AA in FIG. 2A. Hook 212 has a first part on one side of shaft 210 and a second. part on the other side of shaft 210.

The end or tip of the first part of hook 212 is bent. When the hook is in the "latched" position. the end or tip of the first part of hook fits into, or engages with, a hole 214 formed in a side wall of top case 102. When engaged with the side wall of the top case 102, the tip of hook 212 holds the top case 102 and the bottom case 104 together. When the hook is rotated about shaft 210 into the "open" position (as shown by the dashed lines in FIG. 2B), the end or tip of the first part of hook no longer engages with the hole 214. Therefore when hook 212 is in the open position the latch 200 allows the top case 102 to be removed from the bottom case 104.

Figure 3:
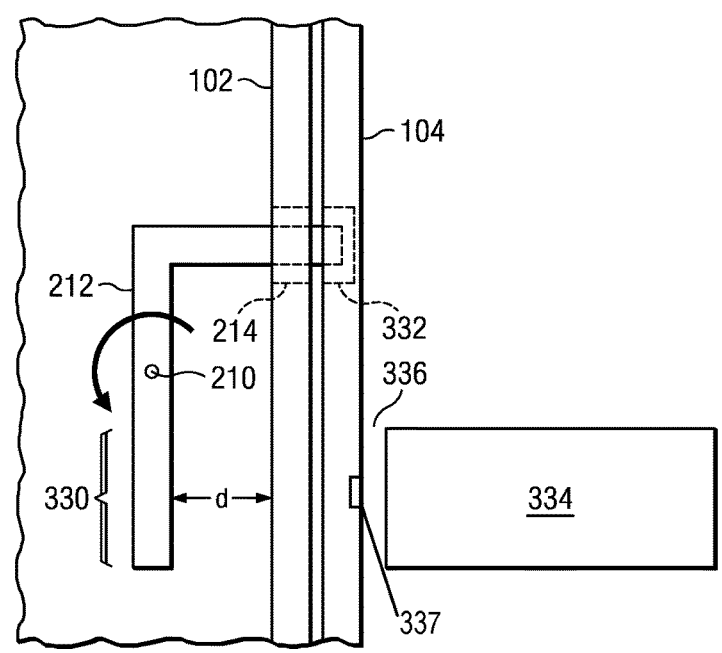
FIG. 3 is a top sectional view of another example latch.

FIG. 3 is a top sectional view of another example latch. In this example the side wall of bottom case 104 has a recess 332 that aligns with the hole 214 in the side wall of top case 102 when the two case parts are mated together. When the hook 212 is in the "latched" position the tip of the first part engages with the hole 214 in the side wall of top case 102 and the recess 332 in the side wall of bottom case 104. Because the end of the hook 212 engages with both walls, there may be less torque applied against the shaft 210 when someone tries to open the top case when the hook is in the latched position. In both examples (shown in FIGS. 2 and 3) the hook 212 is completely enclosed by the top and bottom cases when the cases are mated together.

The second part of the hook 212 (shown as section 330 in FIG. 3), opposite the bent part of the hook 212, is fabricated from a ferrous material, for example iron or steel. The two side walls of the case parts are fabricated from a non-ferrous material, for example plastic or aluminum. When a magnet 334 is placed adjacent to the second part 330 of the hook 212 on the outside of the case parts, a magnetic force is created between the magnet 334 and the second part 330 of the hook 212. The magnetic force causes the hook to rotate into the first or open position, thereby releasing the top case 102 from the bottom case. In one example a mark or target 337 may be located on the outside of the bottom case 336 to show where the magnet should be placed to open the latch.

As shown in FIG. 2A, a spring 215 may be positioned on latch 200 to move the hook into the second or latched position in the absence of a magnetic force. In some examples the spring may be a coil spring mounted to shaft 210. The spring force does not oppose the opening force from the top case (i.e. the spring force acts perpendicular to the opening force of the top case). In some examples the tip of the first part of latch 212 may be chamfered to allow the top case 102 to be assembled onto the bottom case 104 without the use of a magnet to hold the hook 212 in the open position.

The thickness of the side walls of the top and bottom cases, the amount of ferrous material in section 330 of hook 212, the force of the spring holding the hook 212 in the latched position, the distance between the magnet and section 330, and the strength of the magnet control the amount of magnetic force between the magnet and section 330.

In one example the wall thickness T1 of the bottom case is between 1-1.5 mm (see FIG. 2A). The wall thickness T2 of the top case is also between 1 and 1.5 mm. In other examples the wall thickness of the case parts may be in the range between 0.5-3.0 mm. The distance d between section 330 of hook 212 and the inside surface of the top case 102 (see FIG. 3) is based on how far the tip needs to move to disengage from the top and bottom case parts. For example, when the wall thicknesses of the two case parts are 1 mm and the recess 332 is 0.5 mm deep, and a clearance of 0.5 mm between the tip and the top case is desired, the tip would be moved 1 mm (top case wall thickness)+0.5 mm (recess depth)+0.5 mm (clearance)=2 mm between the latched position and the open position.

Once distance d is determined, the strength of the magnet can be determined. In the example above, the magnet can be brought to within about 4 mm of section 330 of hook 212. Using this distance, and the amount of ferrous material in section 330, the strength of magnet 334 can be determined. The magnet does not need to be a magnet with poles. The magnet used can be a permanent magnet, an electro magnet, a ceramic magnet, or the like. Because the latch is opened using a magnet, there are no loose parts that can be lost when the case is opened. In addition, no openings are required in the outer case part which allows for a smooth unbroken look to the case parts. In the examples above, the latch was shown attached to the bottom case part 104. In other examples the latch may be attached to the top case part 102.

Figure 4:
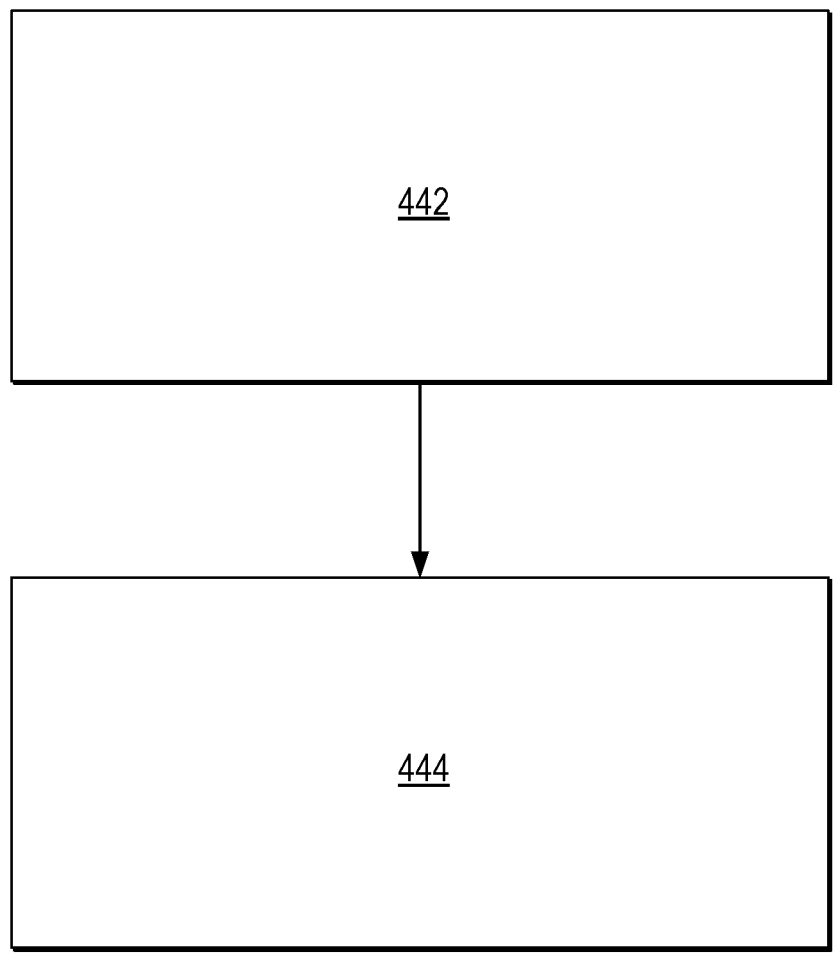
FIG. 4 is a flow chart for an example method of manufacturing a computer

FIG. 4 is a flow chart for an example method of manufacturing a computer. At step 442 a first case part and a second case part are formed with side walls fabricated from a non-ferrous material. The first and second case parts form an enclosure when mated together. At step 444 a latch is attached to the first case part. The latch comprises a shaft and a hook rotatably attached to the shaft, where the hook can rotate between and open position and a latched position, the hook having a first side and a second side. Wherein the first side of the hook is engaged with a hole formed in the side wall of the first case when the hook is in the latched position and the first and second cases are mated, and where the first side of the hook is disengaged with the hole when the hook is in the open position. And the second side of the hook formed of a ferrous material and located adjacent to the side wall of the first case, wherein the hook rotates to the open position when a magnet is positioned on an outside of the side wall of the first case, near the second side of the hook.

What is claimed is:

1. A computer, comprising:
    a first case and a second case that removably mate together to form an enclosure;
    a shaft attached to the first case;
    a hook rotatably coupled to the shaft and having an open position and a latched position, the hook including a first side and a second side;
    wherein the first side of the hook is engaged with a hole formed in a side wall of the second case when the hook is in the latched position and the first and second cases are mated, and where the first side of the hook is disengaged from the hole when the hook is in the open position;
    the second side of the hook is formed of a ferrous material and located adjacent to a side wall of the first case, wherein the hook rotates to the open position responsive to a magnet being positioned on an outside of the side wall of the first case, near the second side of the hook; and
    a coil spring coupled to the shaft and forcing the hook towards the latched position.

2. The computer of claim 1, wherein the first side of the hook comprises a first part of the hook, the first part extending through the hole formed in the side wall of the second case and into a recess in the first case when the hook is in the latched position and the first and second cases are mated.

3. The computer of claim 1, wherein the side wall of the first case does not have an opening through the side wall of the first case in an area adjacent to the latch.

4. The computer of claim 1, wherein the side wall of the second case is between 0.5 and 3 mm in thickness, and the side wall of the first case is between 0.5 and 3 mm in thickness.

5. The computer of claim 1, wherein the side wall of the second case and the side wall of the first case are fabricated from a non-ferrous material.

6. The computer of claim 1, further comprising a computer component enclosed by the second case and the first case when the first and second cases are mated, where the computer component is selected from the group consisting of: a mother board, a memory, a hard disk drive, a DVD drive, and an I/O card.

7. The computer of claim 1, wherein the second case is attached to the first case with a hinge.

8. The computer of claim 1, further comprising:
    a mark or target on the outside of the side wall of the first case that indicates a location on the outside of the side wall where placement of the magnet causes rotation of the hook into the open position.

9. The computer of claim 1, wherein the hook is rotatable about the shaft.

10. The computer of claim 1, wherein the hook rotates to the open position responsive to the magnet being positioned near the second side of the hook outside of the side wall of the first case and outside of the second case.

11. The computer of claim 1, wherein the first case has a bottom wall, the side wall of the first case angled with respect to the bottom wall, the shaft attached to the bottom wall of the first case, and the side wall of the first case to receive and engage the second case.

12. The computer of claim 11, wherein the side wall of the first case is outside the side wall of the second case when the second case is received in the first case.

13. A method of manufacturing a computer, comprising
    forming a first case with a side wall fabricated from a non-ferrous material;
    forming a second case with a side wall fabricated from a non-ferrous material, wherein the first case and the second case removably mate together to form an enclosure;
    attaching a latch to the first case, where the latch comprises:
        a shaft attached to the first case, and
        a hook rotatably attached to the shaft, where the hook is rotatable between an open position and a latched position, the hook having a first side and a second side;
        wherein the first side of the hook is engaged with a hole formed in the side wall of the second case when the hook is in the latched position and the first and second cases are mated, and where the first side of the hook is disengaged from the hole when the hook is in the open position; and
        the second side of the hook formed of a ferrous material and located adjacent to the side wall of the first case, wherein the hook rotates to the open position responsive to a magnet positioned on an outside of the side wall of the first case, near the second side of the hook; and
    attaching a coil spring to the shaft that forces the hook towards the latched position.

14. The method of claim 13, further comprising:
    marking a position with a mark on the outside of the side wall of the first case that indicates a location on the outside of the side wall where placement of the magnet causes rotation of the hook into the open position.

15. The method of claim 13, wherein the first side of the hook extends through the hole formed in the side wall of the second case and into a recess in the first case when the hook is in the latched position and the first and second cases are mated.

16. The method of claim 13, further comprising:
    installing a computer component into the first case, where the computer component is selected from the group of computer components consisting of: a mother board, memory, a hard disk drive, a DVD drive, and an I/O card.

17. The method of claim 13, further comprising forming the first case with a bottom wall, the side wall of the first case angled with respect to the bottom wall of the first case, the shaft attached to the bottom wall of the first case, and the side wall of the first case to receive and engage the second case.

18. The method of claim 17, wherein the side wall of the first case is outside the side wall of the second case when the second case is received in the first case.

19. A device comprising:
- a first case and a second case that removably mate together to form an enclosure;
- a shaft attached to the first case;
- a hook rotatably coupled to the shaft and having an open position and a latched position, the hook including a first part and a second part;
- wherein the first part of the hook is engaged with a hole formed in a side wall of the second case when the hook is in the latched position and the first and second cases are mated, and where the first part of the hook is disengaged from the hole when the hook is in the open position;
- wherein the second part of the hook is formed of a ferrous material, and the hook is rotatable from the latched position to the open position responsive to a magnet being positioned on an outside of the side wall of the first case; and
- a coil spring coupled to the shaft and forcing the hook towards the latched position.

20. The device of claim 19, wherein the side wall of the first case comprises a recess, and wherein the first part of the hook extends through the hole formed in the side wall of the second case and into the recess of the side wall of the first case when the hook is in the latched position.

* * * * *